(12) United States Patent
Huang et al.

(10) Patent No.: US 11,775,093 B2
(45) Date of Patent: Oct. 3, 2023

(54) TOUCH DISPLAY DEVICE

(71) Applicant: HUIZHOU CHINA STAR OPTOELECTRONICS TECHNOLOGY CO., LTD., Guangdong (CN)

(72) Inventors: Dongchen Huang, Guangdong (CN); Chingyuan Cheng, Guangdong (CN)

(73) Assignee: HUIZHOU CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 639 days.

(21) Appl. No.: 16/961,717

(22) PCT Filed: Jul. 3, 2020

(86) PCT No.: PCT/CN2020/100095
§ 371 (c)(1),
(2) Date: Jul. 13, 2020

(87) PCT Pub. No.: WO2021/248598
PCT Pub. Date: Dec. 16, 2021

(65) Prior Publication Data
US 2023/0115498 A1    Apr. 13, 2023

(30) Foreign Application Priority Data
Jun. 12, 2020 (CN) .......................... 202010537118.3

(51) Int. Cl.
*G06F 3/041* (2006.01)
*H01L 27/12* (2006.01)
*G02B 5/30* (2006.01)
*G02B 5/20* (2006.01)

(52) U.S. Cl.
CPC ............ *G06F 3/0412* (2013.01); *H01L 27/124* (2013.01); *G02B 5/201* (2013.01); *G02B 5/3025* (2013.01); *G06F 2203/04103* (2013.01); *G06F 2203/04107* (2013.01)

(58) Field of Classification Search
CPC ........ G06F 3/04102; G06F 2203/04103; G06F 2203/04107; G02F 1/13338; G02B 5/3025
See application file for complete search history.

(56) References Cited

U.S. PATENT DOCUMENTS

| | | | | |
|---|---|---|---|---|
| 11,287,914 | B2* | 3/2022 | Huang et al. | ......... G06F 3/0412 |
| 11,494,014 | B2* | 11/2022 | Cheng | ................. G02F 1/13338 |
| 2002/0180712 | A1* | 12/2002 | Sato et al. | ............. G06F 3/041 345/173 |
| 2007/0103854 | A1 | 5/2007 | Yu et al. | |
| 2008/0068342 | A1* | 3/2008 | Chang et al. | ......... G06F 3/0412 345/173 |
| 2013/0169569 | A1* | 7/2013 | Shih | ...................... G06F 3/041 345/173 |

(Continued)

FOREIGN PATENT DOCUMENTS

| | | | |
|---|---|---|---|
| CN | 102819343 | A | 12/2012 |
| CN | 105137635 | A | 12/2015 |
| CN | 105652504 | A | 6/2016 |
| CN | 109545838 | A * | 3/2019 ................G06F 3/0412 |

(Continued)

*Primary Examiner* — Joe H Cheng
(74) *Attorney, Agent, or Firm* — SOROKER AGMON NORDMAN RIBA (57) ABSTRACT

A touch display device is provided. The touch display comprises a display area and a non-display area adjacent to the display area. The touch display device further comprises a display panel, a touch panel disposed opposite to the display panel, and a first narrow frame glue disposed between the display panel and the touch panel in the non-display area. The display panel comprises a non-display transparent portion corresponding to the first narrow frame glue in the non-display area.

19 Claims, 6 Drawing Sheets

(56) References Cited

U.S. PATENT DOCUMENTS

| | | | |
|---|---|---|---|
| 2017/0068364 A1 | 3/2017 | Xu et al. | |
| 2017/0083129 A1* | 3/2017 | Jin | G06F 3/0412 |
| 2017/0205925 A1 | 7/2017 | Yamazaki et al. | |
| 2017/0276986 A1* | 9/2017 | Chen et al. | G02F 1/133528 |
| 2020/0041832 A1* | 2/2020 | Hsu | G02F 1/133308 |
| 2022/0026751 A1* | 1/2022 | Liu | G02F 1/1339 |

FOREIGN PATENT DOCUMENTS

| | | | |
|---|---|---|---|
| CN | 109633993 A | 4/2019 | |
| CN | 110413151 A | 11/2019 | |
| CN | 110413154 A | 11/2019 | |
| CN | 111025735 A | 4/2020 | |
| CN | 111061078 A | 4/2020 | |

* cited by examiner

| Providing a touch panel and a display panel. The touch display device comprises a display area and a non-display area adjacent to the display area. The display panel comprises a non-display transparent portion in the non-display area. | Step S100 |

↓

| Forming a first narrow frame glue on the touch panel or the display panel in the non-display area, aligning the touch panel with the display panel, and irradiating a curing light through the non-display transparent portion to the first narrow frame glue to cure the first narrow frame glue by bottom light curing. | Step S200 |

TOUCH DISPLAY DEVICE

This application is the National Stage filing under 35 U.S.C. 371 of PCT/CN2020/100095 filed on Jul. 3, 2020, which claims priority under 35 U.S.C. §119 of Chinese Application No. 202010537118.3.X filed on Jun. 12, 2020, the entire contents of which are hereby incorporated by reference into this application.

FIELD OF INVENTION

The present disclosure relates to the technical field of display, and particularly to a touch display device.

BACKGROUND

With the development of display technology, large, narrow-framed touch displays have become a focus of the industry. A current touch display screen is mainly composed of a display panel and a touch panel that are bonded together through a frame glue. As a part of the display panel and a part of the touch panel in a non-display area are opaque, light for curing the frame glue cannot pass through the display panel and the touch panel disposed on upper and lower sides of the frame glue to cure the frame glue by a bottom light curing. Therefore, when the display panel and the touch panel are bonded together, the frame glue can only be cured with a side-facing light. However, due to a narrow gap between the display panel and the touch panel, low light reflectivities of the display panel and the touch panel, and the like, an area of the frame glue irradiated by the curing light and a light intensity received by the frame glue are less, resulting in an insufficient curing rate and an insufficient curing depth of the frame glue, so that the frame glue needs to have a greater width to ensure that the display panel and the touch panel can be bonded into a box, which increases a frame width of a box-shaped structure such as the touch display screen.

In current touch display screens, the display panel and the touch panel can only be bonded together by curing with a side-facing light. Because an area of the frame glue irradiated by the curing light and a light intensity received by the frame glue are less, a curing rate and a curing depth of the frame glue are insufficient. Therefore, the frame glue needs to have a greater width to ensure that the display panel and the touch panel can be bonded into a box, which increases a frame width of a box-shaped structure such as the touch display screen.

SUMMARY OF DISCLOSURE

The present disclosure provides a touch display device to solve the technical problems that "In current touch display screens, the display panel and the touch panel can only be bonded together by curing with a side-facing light. Because an area of the frame glue irradiated by the curing light and a light intensity received by the frame glue are less, a curing rate and a curing depth of the frame glue are insufficient. Therefore, the frame glue needs to have a greater width to ensure that the display panel and the touch panel can be bonded into a box, which increases a frame width of a box-shaped structure such as the touch display screen."

In order to solve the above problems, the present disclosure provides the following technical solutions.

The present disclosure provides a touch display device comprising a display area and a non-display area adjacent to the display area. The touch display device further comprises a display panel, a touch panel disposed opposite to the display panel, and a first narrow frame glue disposed between the display panel and the touch panel in the non-display area. The display panel comprises a non-display transparent portion corresponding to the first narrow frame glue in the non-display area.

In the touch display device, the display panel comprises a first transparent substrate, a second transparent substrate disposed opposite to the first transparent substrate, and a second narrow frame glue disposed between the first transparent substrate and the second transparent substrate in the non-display area. The non-display transparent portion comprises the second narrow frame glue, a part of the first transparent substrate in the non-display area, and a part of the second transparent substrate in the non-display area.

In the touch display device, the first transparent substrate comprises a thin film transistor (TFT) glass substrate and a thin film transistor layer disposed on the TFT glass substrate. A part of the thin film transistor layer in the non-display area comprises a plurality of first metal traces disposed on the TFT glass substrate, a first transparent insulating layer covering the TFT glass substrate and the first metal traces, a plurality of second metal traces disposed on the first transparent insulating layer, and a second transparent insulating layer covering the first transparent insulating layer and the second metal traces. The second transparent substrate comprises a color filter glass substrate.

The touch display device further comprises a light shielding layer disposed in the touch panel in the non-display area.

In the touch display device, the touch panel comprises a package cover, a touch substrate disposed opposite to the package cover, and a third narrow frame glue disposed between the package cover and the touch substrate in the non-display area. The light shielding layer is disposed between the third narrow frame glue and the package cover.

The touch display device further comprises a color filter layer disposed in the display panel or the touch panel. The color filter layer comprises a first hollow portion in the non-display area.

In the touch display device, the color filter layer is disposed in the display panel. The second narrow frame glue extends into the first hollow portion, so that both sides of the second narrow frame glue are respectively bonded to the first transparent substrate and the second transparent substrate. The color filter layer is disposed on a side of the first transparent substrate close to the second transparent substrate, or a side of the second transparent substrate close to the first transparent substrate.

In the touch display device, the color filter layer is disposed in the touch panel. The color filter layer and the light shielding layer are disposed on a same side of the package cover close to the touch substrate. The light shielding layer is disposed in the first hollow portion.

In the touch display device, the color filter layer comprises a black matrix and a plurality of color resists disposed in the black matrix. The black matrix and the light shielding layer have a same material and are integrally formed.

The touch display device further comprises an upper polarizer. The upper polarizer comprises a second hollow portion in the non-display area. The upper polarizer is disposed on a side of the display panel close to the touch panel, and the first narrow frame glue extends into the second hollow portion, so that the first narrow frame glue is bonded to the display panel. Alternately, the upper polarizer is disposed on a side of the touch substrate close to the package cover, and the third narrow frame glue extends into the second hollow portion, so that the third narrow frame glue is bonded to the touch substrate.

The touch display device further comprises a lower polarizer disposed on a side of the display panel away from the touch panel. The lower polarizer comprises a third hollow portion corresponding to the non-display transparent portion in the non-display area.

In the present invention, a portion of the display panel corresponding to the first narrow frame glue in the non-display area is configured as the non-display transparent portion. When the display panel and the touch panel are bonded together, this facilitates a curing light to pass through the non-display transparent portion of the display panel to irradiate and cure the first narrow frame glue by a bottom light curing. Compared with curing with a side-facing light, this greatly increases an area of the first narrow frame glue irradiated by the curing light and a total light intensity received by the first narrow frame glue from the curing light, thereby improving a curing rate of the first narrow frame glue. Therefore, the first narrow frame glue with a smaller width can be used to bond the display panel and the touch panel into a box, thereby narrowing a frame of a box-shaped structure such as the touch display device. Obviously, the touch display device of the present invention reduces a part of a light shielding structure and improves the curing rate of the frame glue by curing with a bottom light, which saves a part of process steps for manufacturing the light shielding structure of the touch display device and a curing time of the frame glue. This manufacturing process is mature and convenient for manufacturing a touch display device with a narrow frame.

BRIEF DESCRIPTION OF DRAWINGS

In order to more clearly illustrate technical solutions in embodiments of the present disclosure, a brief description of accompanying drawings used in the description of the embodiments of the present disclosure will be given below. Obviously, the accompanying drawings in the following description are merely some embodiments of the present disclosure. For those skilled in the art, other drawings may be obtained from these accompanying drawings without creative labor.

DETAILED DESCRIPTION

The following description of various embodiments of the present disclosure with reference to the accompanying drawings is used to illustrate specific embodiments that can be practiced. Directional terms mentioned in the present disclosure, such as "above", "below", "front", "back", "left", "right", "inside", "outside", "side", are merely used to indicate the direction of the accompanying drawings. Therefore, the directional terms are used for illustrating and understanding the present disclosure rather than limiting the present disclosure. In the figures, elements with similar structures are indicated by the same reference numerals.

In the description of the present disclosure, it should be understood that location or position relationships indicated by terms, such as "center", "longitudinal", "transverse", "length", "width", "thickness", "up", "down", "front", "rear", "left", "right", "vertical", "horizontal", "top", "bottom", "within", "outside", "clockwise", and "counterclockwise" are location or position relationships based on an illustration of the accompanying drawings, are merely used for describing the present disclosure and simplifying the description instead of indicating or implying the indicated apparatuses or elements should have specified locations or be constructed and operated according to specified locations, and thereof, should not be intercepted as limitations to the present disclosure. Furthermore, terms such as "first" and "second" are used merely for description, but shall not be construed as indicating or implying relative importance or implicitly indicating a number of the indicated technical feature. Hence, the feature defined with "first" and "second" may explicitly or implicitly includes one or more such features. In the description of the present disclosure, a term "a plurality of" means "two or more" unless otherwise specifically limited.

In the present disclosure, it should be noted that, unless otherwise explicitly specified or defined, the terms such as "mount", "connect", and "connection" should be interpreted in a broad sense. For example, a connection may be a fixed connection, a detachable connection, or an integral connection. A connection may be a mechanical connection, an electrical connection, or a mutual communication. A connection may be a direct connection or may be an indirect connection by using an intermediate medium. A connection may be an internal connection or an interaction between two elements. It may be appreciated by those of ordinary skill in the art that the specific meanings of the aforementioned terms in the present disclosure can be understood depending on specific situations.

In the present disclosure, unless otherwise specifically specified or limited, a structure in which a first feature is "on" or "under" a second feature may comprise an embodiment in which the first feature directly contacts the second feature, and may also comprise an embodiment in which the first feature and the second feature are not in direct contact with each other, but are contacted via an additional feature formed therebetween. Furthermore, a structure in which a first feature is "on", "above", or "on top of" a second feature may comprise an embodiment in which the first feature is right or obliquely "on", "above", or "on top of" the second feature, or just means that a sea-level elevation of the first feature is greater than a sea-level elevation of the second feature. A structure in which a first feature "under", "below", or "on bottom of" a second feature may include an embodiment in which the first feature is right "beneath," "below," or "on bottom of" the second feature, and may also comprises an embodiment in which the first feature is right or obliquely "under", "below", or "on bottom of" the second feature, or just means that a sea-level elevation of the first feature is less than a sea-level elevation of the second feature.

The following description provides different embodiments or examples illustrating various structures of the present invention. In order to simplify the description of the present disclosure, only components and settings of specific examples are described below. They are only examples and are not intended to limit the present invention. Furthermore, reference numerals and/or letters may be repeated in different examples of the present disclosure. Such repetitions are for simplicity and clarity, which per se do not indicate relations among the discussed embodiments and/or settings. Furthermore, the present disclosure provides various examples of specific processes and materials, but those skilled in the art can be aware of application of other processes and/or use of other materials.

Technical solutions of the present disclosure will now be described in conjunction with specific embodiments.

Figure 1:
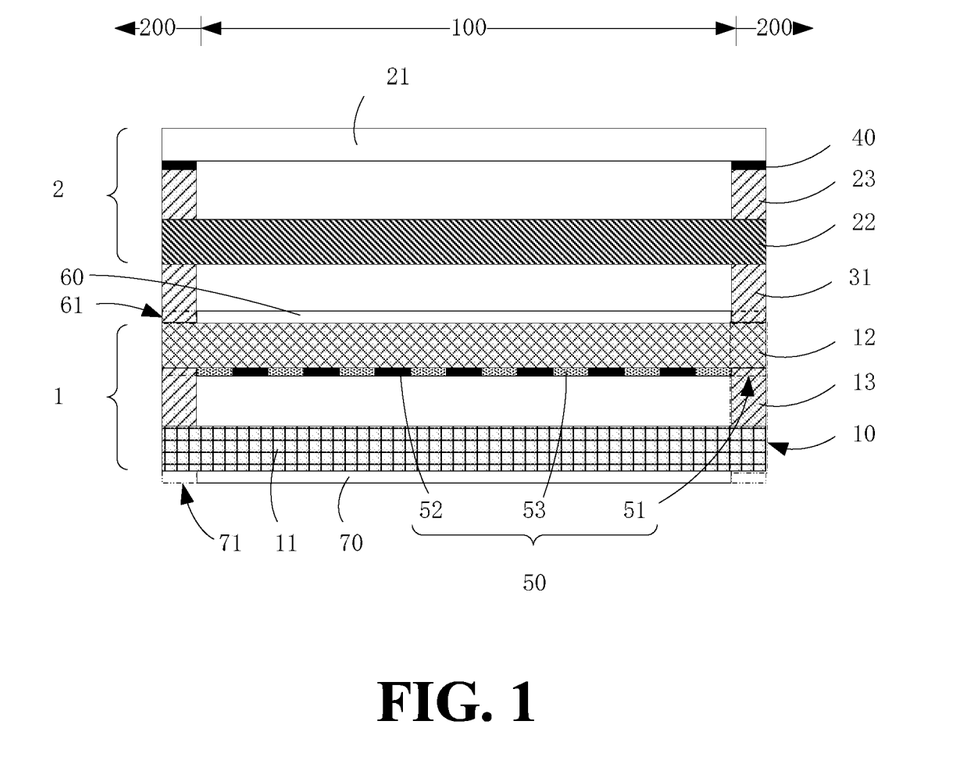
FIG. 1 is a schematic diagram of a first structure of a touch display device according to an embodiment of the present disclosure.
Figure 2:
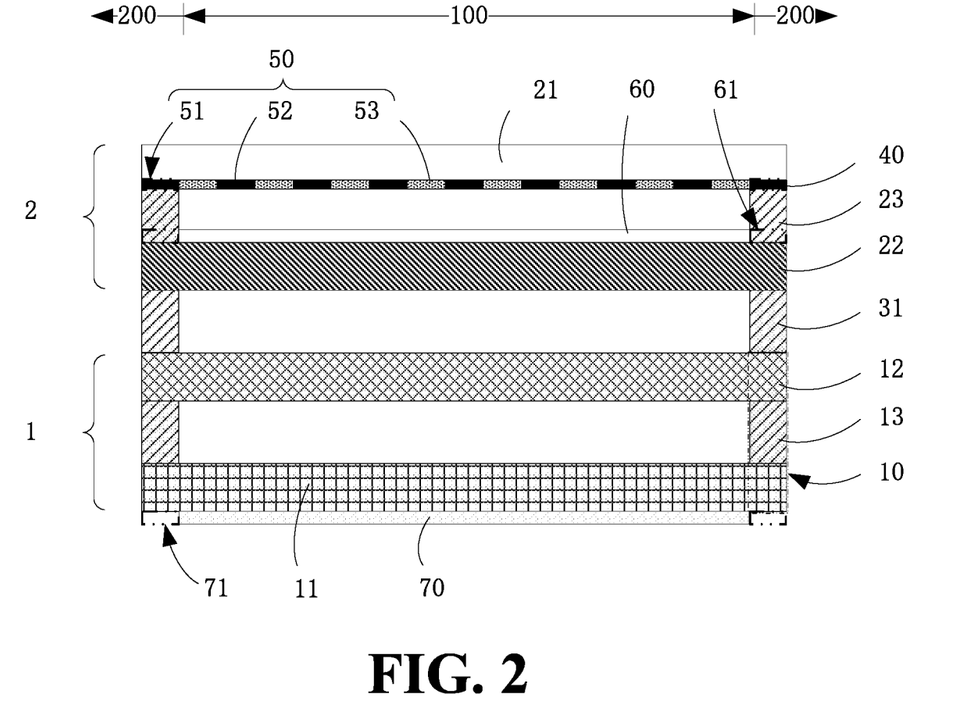
FIG. 2 is a schematic diagram of a second structure of a touch display device according to an embodiment of the present disclosure.

As shown in FIG. 1 and FIG. 2, the present disclosure provides a touch display device comprising a display area 100 and a non-display area 200 adjacent to the display area 100. The touch display device further comprises a display panel 1, a touch panel 2 disposed opposite to the display panel 1, and a first narrow frame glue 31 disposed between the display panel 1 and the touch panel 2 in the non-display area 200. The display panel 1 comprises a non-display transparent portion 10 corresponding to the first narrow frame glue 31 in the non-display area 200.

It can be understood that a current touch display screen is mainly composed of a display panel and a touch panel that are bonded together through a frame glue. A part of the display panel and a part of the touch panel in a non-display area are opaque. A light for curing the frame glue cannot pass through the display panel and the touch panel disposed on upper and lower sides of the frame glue to cure the frame glue by a bottom light curing. Therefore, when the display panel and the touch panel are bonded together, the frame glue can only be cured with a side-facing light. However, due to a narrow gap between the display panel and the touch panel, low light reflectivities of the display panel and the touch panel, and the like, an area of the frame glue irradiated by the curing light and a light intensity received by the frame glue are less, resulting in an insufficient curing rate and an insufficient curing depth of the frame glue, so that the frame glue needs to have a greater width to ensure that the display panel and the touch panel can be bonded into a box, which increases a frame width of a box-shaped structure such as the touch display screen. In this embodiment, a portion of the display panel 1 corresponding to the first narrow frame glue 31 in the non-display area 200 is configured as the non-display transparent portion 100. When the display panel 1 and the touch panel 2 are bonded together, this facilitates a curing light to pass through the non-display transparent portion 10 of the display panel 1 to irradiate and cure the first narrow frame glue 31 by a bottom light curing. Compared with curing with a side-facing light, this greatly increases an area of the first narrow frame glue 31 irradiated by the curing light and a total light intensity received by the first narrow frame glue 31 from the curing light, thereby improving a curing rate of the first narrow frame glue 31. Therefore, the first narrow frame glue 31 with a smaller width can be used to bond the display panel 1 and the touch panel 2 into a box, thereby narrowing a frame of a box-shaped structure such as the touch display device.

As mentioned above, in this embodiment, the display panel 1 comprises a non-display transparent portion 10 corresponding to the first narrow frame glue 31. A portion of the display panel 1 corresponding to the first narrow frame glue 31 in the non-display area 200 is configured as the non-display transparent portion 100. When the display panel 1 and the touch panel 2 are bonded together, this facilitates a curing light to pass through the non-display transparent portion 10 of the display panel 1 to irradiate and cure the first narrow frame glue 31 by a bottom light curing. Obviously, in a device with a box-shaped structure such as the touch display device, a thickness of the first narrow frame glue 31 between the display panel 1 and the touch panel 2 is much less than a width of the first narrow frame glue 31 in a direction parallel to the display panel 1. Compared with curing with a side-facing light, curing with a bottom light at the display panel 1 not only greatly increases an area of the first narrow frame glue 31 irradiated by the curing light, but also reduces a curing depth of the curing light penetrating the first narrow frame glue 31, thereby improving a curing rate of the first narrow frame glue 31. Therefore, the first narrow frame glue 31 with a smaller width can be used to bond the display panel 1 and the touch panel 2 into a box, thereby reducing a frame width of a box-shaped structure such as the touch display device. It should be noted that in this embodiment, a portion of the display panel 1 corresponding to the first narrow frame glue 31 in the non-display area 200 is configured as the non-display transparent portion 100. The non-display transparent portion 10 is transparent, so that the display panel 1 can also be cured with a bottom light during its manufacturing process, and as described above, a frame of the display panel 1 can also be narrowed.

In an embodiment, as shown in FIG. 1 and FIG. 2, the display panel 1 comprises a first transparent substrate 11, a second transparent substrate 12 disposed opposite to the first transparent substrate 11, and a second narrow frame glue 13 disposed between the first transparent substrate 11 and the second transparent substrate 12 in the non-display area 200. The non-display transparent portion 10 comprises the second narrow frame glue 13, a part of the first transparent substrate 11 in the non-display area 200, and a part of the second transparent substrate 12 in the non-display area 200. It can be understood that, in a process of curing the bonded display panel 1 and the touch panel 2 with a bottom light, a light source such as an ultraviolet light source for curing a frame glue is disposed on a side of the touch display device close to the display panel 1, so that a curing light of the ultraviolet light source sequentially passes through the first transparent substrate 11, the second narrow frame glue 13, and the second transparent substrate 12 to irradiate the first narrow frame glue 31, thereby curing the first narrow frame glue 31 with a bottom light.

Figure 3:
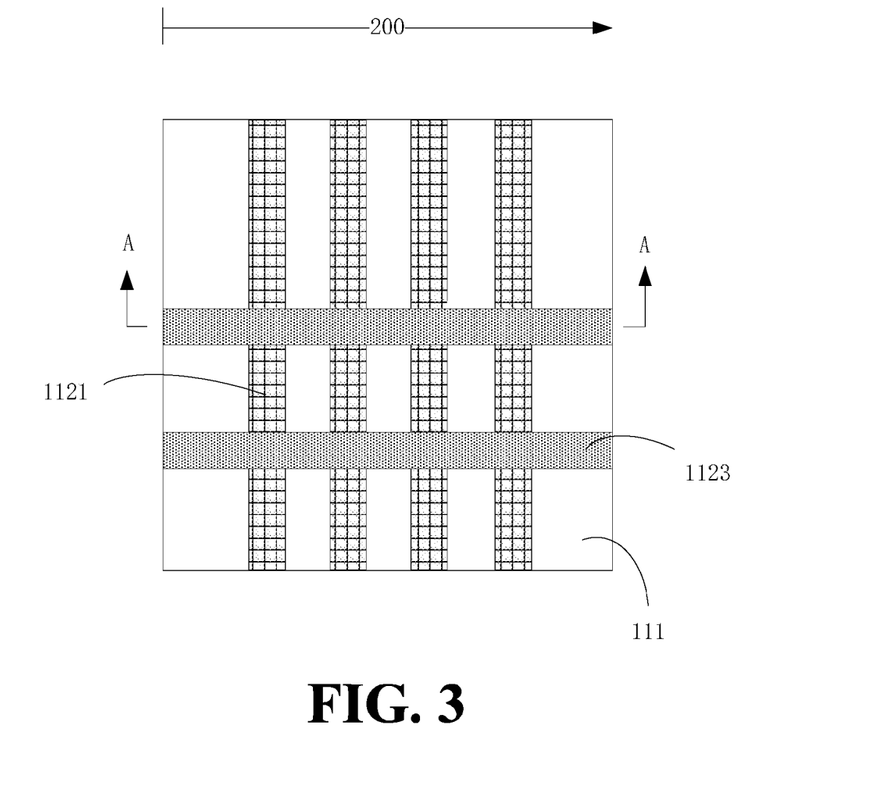
FIG. 3 is a top view of a first transparent substrate in a non-display area according to an embodiment of the present disclosure.
Figure 4:
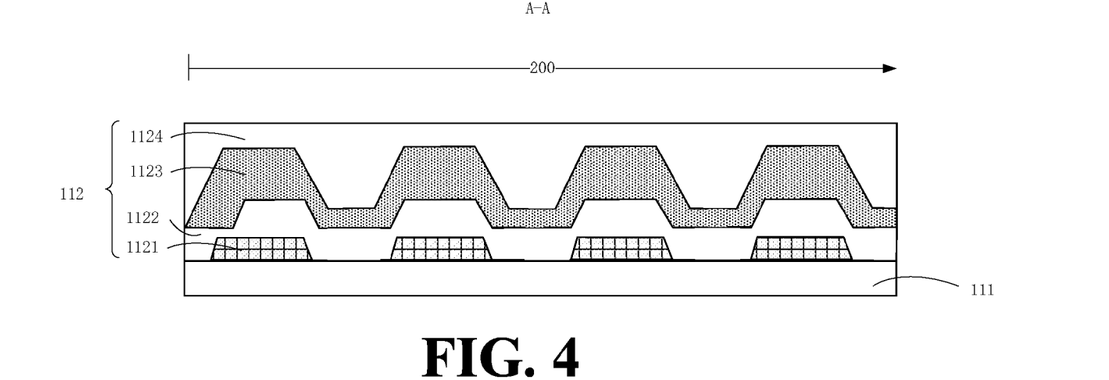
FIG. 4 is a cross-sectional structural schematic diagram along a line A-A in FIG. 3.

Specifically, as shown in FIG. 3 and FIG. 4, the first transparent substrate 11 comprises a thin film transistor (TFT) glass substrate 111 and a thin film transistor layer 112 disposed on the TFT glass substrate 111. A part of the thin film transistor layer 112 in the non-display area 200 comprises a plurality of first metal traces 1121 disposed on the TFT glass substrate 111, a first transparent insulating layer 1122 covering the TFT glass substrate 111 and the first metal traces 1121, a plurality of second metal traces 1123 disposed on the first transparent insulating layer 1122, and a second transparent insulating layer 1124 covering the first transparent insulating layer 1122 and the second metal traces 1123.

The second transparent substrate 12 comprises a color filter glass substrate. In the process of curing the bonded display panel 1 and the touch panel 2 with the bottom light, the curing light can sequentially pass through the TFT glass substrate 111, gaps among the first metal traces 1121, the first transparent insulating layer 1122, gaps among the second metal traces 1123, and the second transparent insulating layer 1124 to achieve light transmission of the first transparent substrate 11.

In an embodiment, as shown in FIG. 1 and FIG. 2, the touch display device further comprises a light shielding layer 40 disposed in the touch panel 2 in the non-display area 200. It can be understood that the light shielding layer 40 is configured to shade a part of the touch display device in the non-display area 200 from light. Obviously, in order to ensure that the display panel 1 and the touch panel 2 can be bonded and cured with a bottom light, the light shielding layer 40 may be disposed on a side of the first narrow frame glue 31 away from the display panel 1 in the touch display device. In this embodiment, the light shielding layer 40 is disposed in the touch panel 2.

Specifically, as shown in FIG. 1 and FIG. 2, the touch panel 2 comprises a package cover 21, a touch substrate 22 disposed opposite to the package cover 21, and a third narrow frame glue 23 disposed between the package cover 21 and the touch substrate 22 in the non-display area 200. The light shielding layer 40 is disposed between the third narrow frame glue 23 and the package cover 21. It can be understood that the light shielding layer 40 may also be disposed on a side of the package cover 21 close to the touch substrate 22. Obviously, in this structure, the light shielding layer 40 not only restricts a display image displayed by the display panel 1 to the display area 100, but also covers a part of the touch display device in the non-display area 200 to prevent internal structures of the touch display device from being exposed to outside of the touch display device and affecting product appearance.

It should be noted that a current touch display screen is mainly composed of a display panel and a touch panel with a protective cover. For physical reinforcement, a thickness of the protective cover is at least greater than 3.0 mm, which is much greater than a thickness of the display panel such as a liquid crystal panel. In addition to the protective cover, the touch panel also comprises a touch substrate and an optical adhesive layer that bonds the protective cover and the touch substrate, which further increases a thickness difference between the display panel and the touch panel. When the display panel and the touch panel are vacuum-bonded together, the thinner display panel is bent toward the touch substrate and then deformed. In addition, the touch panel is also limited in bending due to a full-surface optical adhesive disposed between the protective cover and the touch substrate. In this embodiment, the package cover 21 and the touch substrate 22 are bonded together by the third narrow frame glue 23, so that the touch panel 2 is formed into a box-shaped structure similar to the display panel 1. This solves the problem that the touch panel is limited in bending due to bonding its structure by a full-surface optical adhesive. In addition, it is obvious that the thinner the thickness of the touch panel 2 is, the easier it is to bend. The touch panel 2 with a box-shaped structure can also greatly reduce the thickness of the touch panel 2 to prevent the display panel 1 from being excessively bent toward the touch substrate 22 and then being deformed during vacuum-bonding.

In an embodiment, as shown in FIG. 1 and FIG. 2, the touch display device further comprises a color filter layer 50. The color filter layer 50 comprises a first hollow portion 51 in the non-display area 200. The color filter layer 50 is disposed in the display panel 1 or the touch panel 2. It can be understood that the color filter layer comprises the first hollow portion 51 in the non-display area 200, that is, a part of the color filter layer 50 in the non-display area 200 is removed, so that the color filter layer 50 is disposed in the display area 100. This prevents the color filter layer 50 from affecting a light transmission effect of the display panel 1 in the non-display area 200, so as to ensure a curing effect of a bottom light curing the first narrow frame glue 31.

In an embodiment, as shown in FIG. 1, the color filter layer 50 is disposed in the display panel 1. The second narrow frame glue 13 extends into the first hollow portion 51, so that both sides of the second narrow frame glue 13 are respectively bonded to the first transparent substrate 11 and the second transparent substrate 12. The color filter layer 50 is disposed on a side of the first transparent substrate 11 close to the second transparent substrate 12, or a side of the second transparent substrate 12 close to the first transparent substrate 11.

It can be understood that the second narrow frame glue 13 extends into the first hollow portion 51 to fill the first hollow portion 51, that is, a part of an original color filter layer 50 in the non-display area 200 is replaced with the transparent second narrow frame glue 13. This not only ensures that the box-shaped structure of the display panel 1 is not affected, but also ensures a light transmittance of the non-display transparent portion 10 of the display panel 1 in the non-display area 200 to facilitate curing the first narrow frame glue 31 with a bottom light. In addition, the color filter layer 50 may be disposed on a side of the first transparent substrate 11 close to the second transparent substrate 12, or on a side of the second transparent substrate 12 close to the first transparent substrate 11. Obviously, when the color filter layer 50 is disposed on the side of the first transparent substrate 11 close to the second transparent substrate 12, the first transparent substrate 11 is a color filter on array (CF on array, COA) substrate.

In an embodiment, as shown in FIG. 2, the color filter layer 50 is disposed in the touch panel 2. The color filter layer 50 and the light shielding layer 40 are disposed on a same side of the package cover 21 close to the touch substrate 22. The light shielding layer 40 is disposed in the first hollow portion 51. It can be understood that the color filter layer 50 and the light shielding layer 40 may be disposed on a same side of the package cover 21 close to the touch substrate 22, so that the touch display device has better integrity. Specifically, the color filter layer 50 comprises a black matrix 52 and a plurality of color resists 53 disposed in the black matrix 52. The black matrix 52 and the light shielding layer 40 have a same material and are integrally formed. The black matrix 52 and the light shielding layer 40 are an integrally formed structure, which can be formed by a process at a time to saves process steps and have good integrity, which will not be described in detail herein.

In an embodiment, as shown in FIG. 1 and FIG. 2, the touch display device further comprises an upper polarizer 60. The upper polarizer 60 comprises a second hollow portion 61 in the non-display area 200. The upper polarizer 60 is disposed on a side of the display panel 1 close to the touch panel 2, and the first narrow frame glue 31 extends into the second hollow portion 61, so that the first narrow frame glue 31 is bonded to the display panel 1. Alternately, the upper polarizer 60 is disposed on a side of the touch substrate 22 close to the package cover 21, and the third narrow frame glue 23 extends into the second hollow portion 61, so that the third narrow frame glue 23 is bonded to the touch substrate 22.

It can be understood that the upper polarizer 60 is hollowed out in the non-display area 200 to form the second hollow portion 61, which prevents the upper polarizer 60 from blocking and affecting a curing light in a bottom light curing. Specifically, as shown in FIG. 1, the upper polarizer 60 may be disposed on a side of the display panel 1 close to the touch panel 2. By extending the first narrow frame glue 31 into the second hollow portion 61, the first narrow frame glue 31 is bonded to the display panel 1. This prevents the upper polarizer 60 from blocking a curing light during the bottom light curing of the first narrow frame glue 31, and also ensures stability of the box-shaped structure of the touch panel 2 and the display panel 1 of the touch display device. In addition, as shown in FIG. 2, the upper polarizer 60 may also be disposed on a side of the touch substrate 22 close to the package cover 21. It should be noted that, as described above, a curing rate of the bottom light curing is significantly better than a curing rate of a side-facing light curing. In this embodiment, not only the first narrow frame glue 31 and the second narrow frame glue 13 can be cured with a bottom light, but the third narrow frame glue 23 can also be cured with a bottom light.

In order to prevent the upper polarizer 60 disposed on the side of the touch substrate 22 close to the package cover 21 from affecting a curing light in a bottom light curing of the third narrow frame glue 23. By extending the third narrow frame glue 23 into the second hollow portion 61, the third narrow frame glue 23 is bonded to the touch substrate 22. This prevents the upper polarizer 60 from blocking the curing light during the bottom light curing of the third narrow frame glue 23, and also ensures stability of the box-shaped structure of the packaging cover 21 and the touch substrate 22 of the touch panel 2.

In an embodiment, as shown in FIG. 1 and FIG. 2, the touch display device further comprises a lower polarizer 70 disposed on a side of the display panel 1 away from the touch panel 2. The lower polarizer 70 comprises a third hollow portion 71 corresponding to the non-display transparent portion 10 in the non-display area 200. Obviously, the third hollow portion 71 corresponds to the non-display transparent portion 10 in order to prevent the lower polarizer 70 from blocking a curing light passing through the non-display transparent portion 10.

Figure 6:
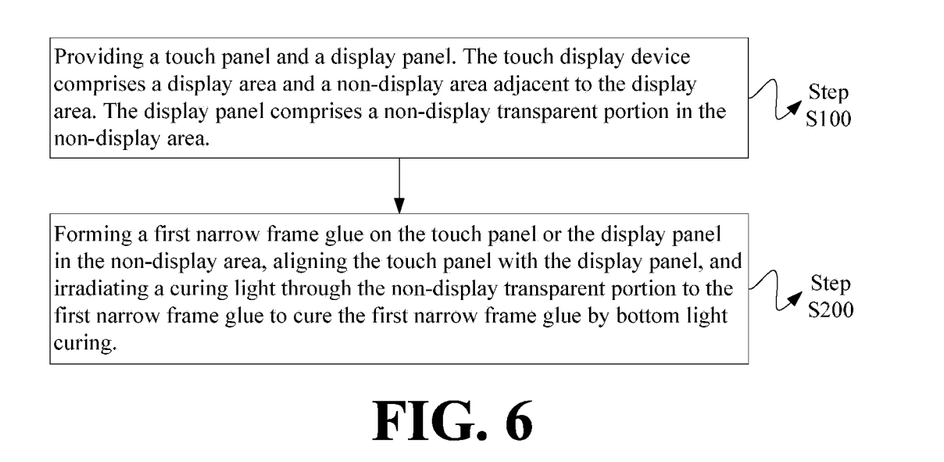
FIG. 6 is a schematic flowchart of a first method for fabricating a touch display device according to an embodiment of the present disclosure.

As shown in FIG. 6, the present disclosure further provides a method for manufacturing a touch display device comprising the following steps.

Step S100: providing a touch panel 2 and a display panel 1. The touch display device comprises a display area 100 and a non-display area 200 adjacent to the display area 100. The display panel 1 comprises a non-display transparent portion 10 in the non-display area 200.

Step S200: forming a first narrow frame glue 31 on the touch panel 2 or the display panel 1 in the non-display area 200, aligning the touch panel 2 with the display panel 1, and irradiating a curing light through the non-display transparent portion 10 to the first narrow frame glue 31 to cure the first narrow frame glue 31 by a bottom light curing.

It can be understood that before the touch panel 2 is aligned with the display panel 1, the first narrow frame glue 31 may be formed on the touch panel 2 or the display panel 1 in the non-display area 200 by coating or dispensing. Specifically, in a process of curing the first narrow frame glue 31 with a bottom light, a side-facing light may also be used to assist curing, which is not limited herein.

Figure 7:
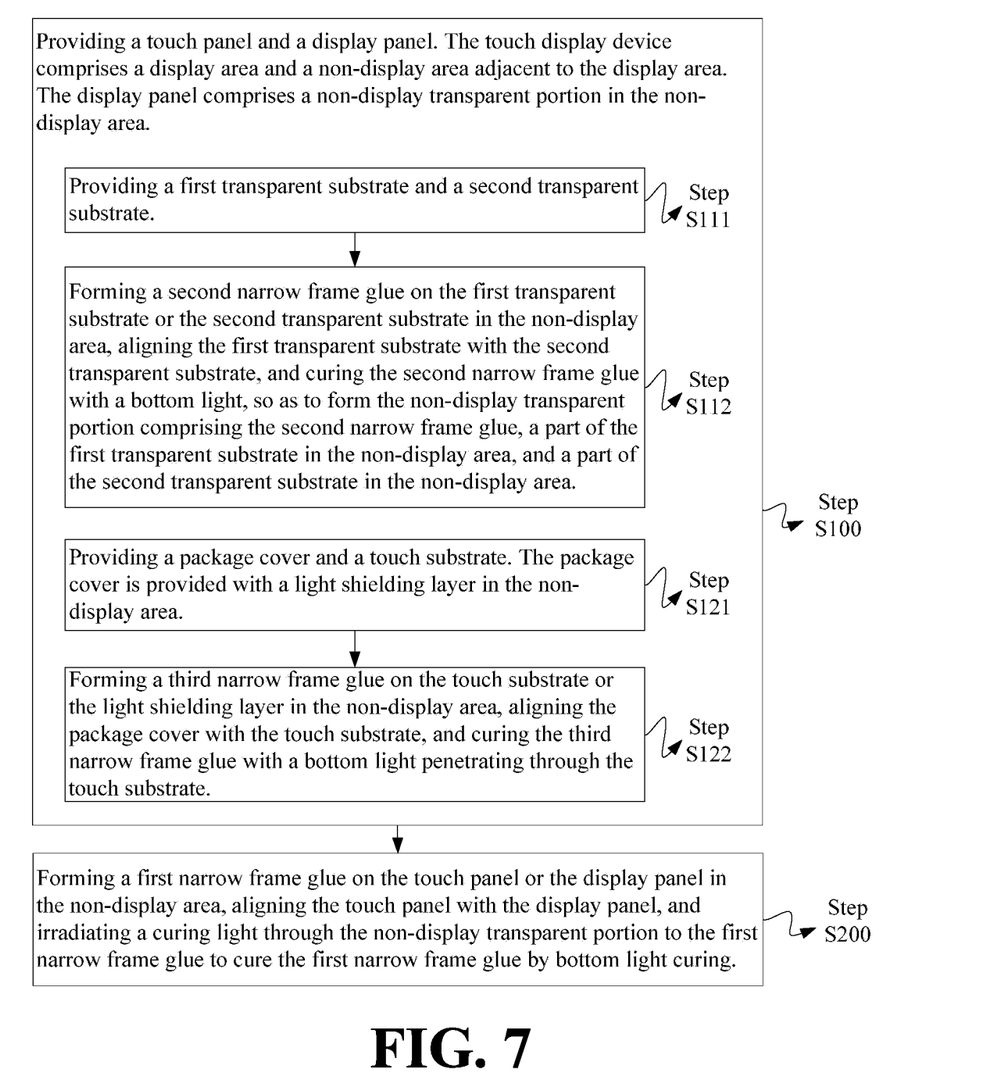
FIG. 7 is a schematic flowchart of a second method for fabricating a touch display device according to an embodiment of the present disclosure.

As shown in FIG. 7, in the method for manufacturing the touch display device of the present disclosure, the providing the display panel 1 comprises the following steps.

Step S111: providing a first transparent substrate 11 and a second transparent substrate 12.

Step S112: forming a second narrow frame glue 13 on the first transparent substrate 11 or the second transparent substrate 12 in the non-display area 200, aligning the first transparent substrate 11 with the second transparent substrate 12, and curing the second narrow frame glue 13 with a bottom light, so as to form the non-display transparent portion 10 comprising the second narrow frame glue 13, a part of the first transparent substrate 11 in the non-display area 200, and a part of the second transparent substrate 12 in the non-display area 200.

It can be understood that in a specific process of curing the second narrow frame glue 13 with a bottom light, the second narrow frame glue 13 may be cured with a bottom light penetrating through the first transparent substrate 11. Alternatively, the second narrow frame glue 13 may also be cured with a bottom light penetrating through the second transparent substrate 12. Of course, the second narrow frame glue 13 may also be cured by bottom lights respectively penetrating through the first transparent substrate 11 and the second transparent substrate 12 at same time. Obviously, as described above, the first transparent substrate 11 in the non-display area 200 is provided with the first metal traces 1121 and the second metal traces 1123 that block a part of a curing light. When only one can be selected to be penetrated with a bottom light in the process of curing the second narrow frame glue 13, in this embodiment, it is selected that the second narrow frame glue 13 is cured with a bottom light penetrating through the second transparent substrate 12.

As shown in FIG. 7, in the method for manufacturing the touch display device of the present disclosure, the providing the touch panel 2 comprises the following steps.

Step S121: providing a package cover 21 and a touch substrate 22. The package cover 21 is provided with a light shielding layer 40 in the non-display area 200.

Step S122: forming a third narrow frame glue 23 on the touch substrate 22 or the light shielding layer 40 in the non-display area 200, aligning the package cover 21 with the touch substrate 22, and curing the third narrow frame glue 23 with a bottom light penetrating through the touch substrate 22.

It can be understood that in a specific process of curing the third narrow frame glue 23 with a bottom light, as described above, the side of the package cover 21 close to the touch substrate 22 is provided with the light shielding layer 40. In this embodiment, it is selected that the third narrow frame glue 23 is cured with a bottom light penetrating through the touch substrate 22.

Figure 8:
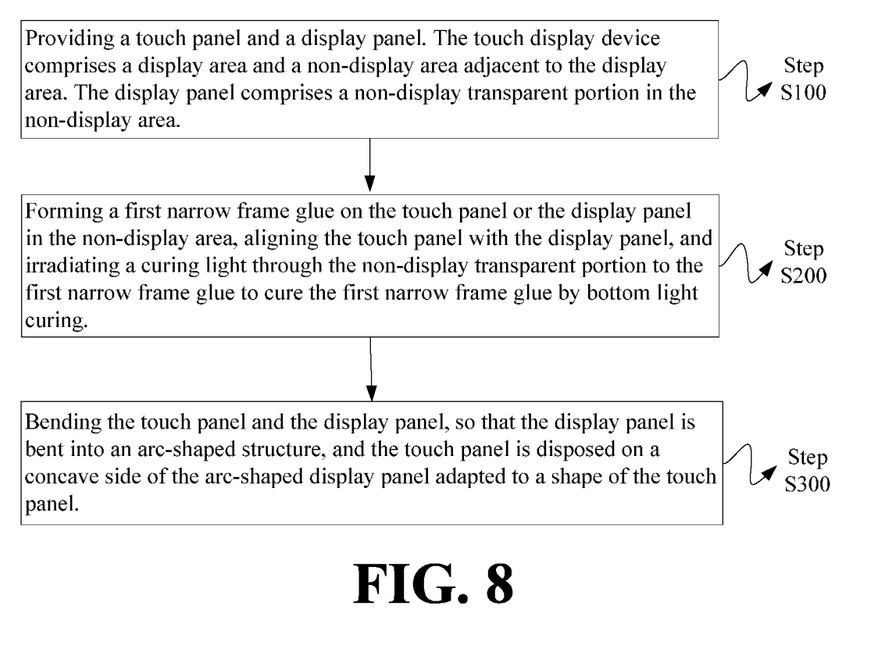
FIG. 8 is a schematic flowchart of a third method for fabricating a touch display device according to an embodiment of the present disclosure.

It should be noted that, as shown in FIG. 8, the method for manufacturing the touch display device may further comprise the following steps.

Step S300: bending the touch panel 2 and the display panel 1, so that the display panel 1 is bent into an arc-shaped structure, and the touch panel 2 is disposed on a concave side of the arc-shaped display panel 1 adapted to a shape of the touch panel 2.

Figure 5:
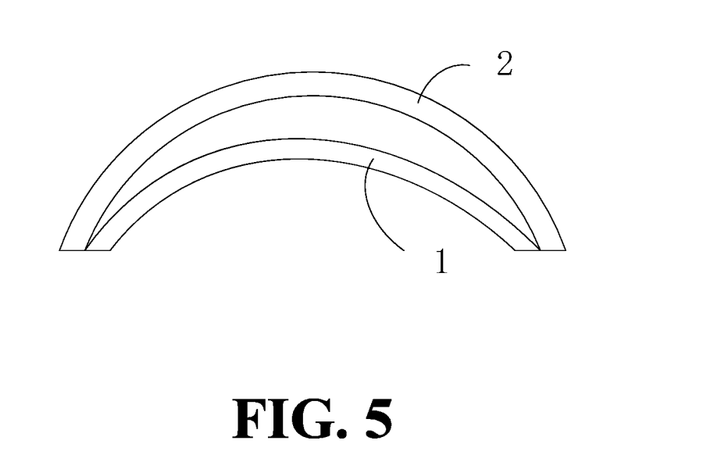
FIG. 5 is a schematic diagram of a third structure of a touch display device according to an embodiment of the present disclosure.

It can be understood that, as shown in FIG. 5, after the touch panel 2 and the display panel 1 are bonded together, the method further comprises a bending step. During the bending step, the touch display device is easily bent into a curved touch display screen because the box-shaped structure of the touch panel 2 reduces the thickness of the touch panel 2 and avoids use of an original full-surface optical adhesive that limits bending.

In the above, in the present invention, a portion of the display panel 1 corresponding to the first narrow frame glue 31 in the non-display area 200 is configured as the non-display transparent portion 10. When the display panel 1 and the touch panel 2 are bonded together, this facilitates a curing light to pass through the non-display transparent portion 10 of the display panel 1 to irradiate and cure the first narrow frame glue 31 by a bottom light curing. Compared with curing with a side-facing light, this greatly increases an area of the first narrow frame glue 31 irradiated by the curing light and a total light intensity received by the first narrow frame glue 31 from the curing light, thereby improving a curing rate of the first narrow frame glue 31. Therefore, the first narrow frame glue 31 with a smaller width can be used to bond the display panel 1 and the touch panel 2 into a box, thereby narrowing a frame of a box-shaped structure such as the touch display device. Obviously, the touch display device of the present invention reduces a part of a light shielding structure and improves the curing rate of the frame glue by curing with a bottom light, which saves a part of process steps for manufacturing the light shielding structure of the touch display device and a curing time of the frame glue. This manufacturing process is mature and convenient for manufacturing a touch display device with a narrow frame.

The present application has been described in the above preferred embodiments, but the preferred embodiments are not intended to limit the scope of the present application, and those skilled in the art may make various modifications without departing from the scope of the present application. The scope of the present application is determined by claims.

What is claimed is:

1. A touch display device, comprising a display area and a non-display area adjacent to the display area, and further comprising:
   a display panel;
   a touch panel disposed opposite to the display panel; and
   a first narrow frame glue disposed between the display panel and the touch panel in the non-display area;
   wherein the display panel comprises a non-display transparent portion corresponding to the first narrow frame glue in the non-display area.

2. The touch display device according to claim 1, wherein: the display panel comprises:
   a first transparent substrate;
   a second transparent substrate disposed opposite to the first transparent substrate; and
   a second narrow frame glue disposed between the first transparent substrate and the second transparent substrate in the non-display area; and
   the non-display transparent portion comprises the second narrow frame glue, a part of the first transparent substrate in the non-display area, and a part of the second transparent substrate in the non-display area.

3. The touch display device according to claim 2, wherein: the first transparent substrate comprises:
   a thin film transistor (TFT) glass substrate; and
   a thin film transistor layer disposed on the TFT glass substrate;
   wherein a part of the thin film transistor layer in the non-display area comprises a plurality of first metal traces disposed on the TFT glass substrate, a first transparent insulating layer covering the TFT glass substrate and the first metal traces, a plurality of second metal traces disposed on the first transparent insulating layer, and a second transparent insulating layer covering the first transparent insulating layer and the second metal traces; and
   the second transparent substrate comprises a color filter glass substrate.

4. The touch display device according to claim 2, further comprising a light shielding layer disposed in the touch panel in the non-display area.

5. The touch display device according to claim 4, wherein:
   the touch panel comprises:
   a package cover;
   a touch substrate disposed opposite to the package cover; and
   a third narrow frame glue disposed between the package cover and the touch substrate in the non-display area; and
   the light shielding layer is disposed between the third narrow frame glue and the package cover.

6. The touch display device according to claim 5, further comprising a color filter layer disposed in the display panel or the touch panel and comprising a first hollow portion in the non-display area.

7. The touch display device according to claim 6, wherein:
   the color filter layer is disposed in the display panel;
   the second narrow frame glue extends into the first hollow portion, so that both sides of the second narrow frame glue are respectively bonded to the first transparent substrate and the second transparent substrate; and
   the color filter layer is disposed on a side of the first transparent substrate close to the second transparent substrate, or on a side of the second transparent substrate close to the first transparent substrate.

8. The touch display device according to claim 6, wherein:
   the color filter layer is disposed in the touch panel;
   the color filter layer and the light shielding layer are disposed on a same side of the package cover close to the touch substrate; and
   the light shielding layer is disposed in the first hollow portion.

9. The touch display device according to claim 8, wherein the color filter layer comprises a black matrix and a plurality of color resists disposed in the black matrix, and the black matrix and the light shielding layer have a same material and are integrally formed.

10. The touch display device according to claim 5, further comprising an upper polarizer that comprises a second hollow portion in the non-display area, wherein:
    the upper polarizer is disposed on a side of the display panel close to the touch panel, and the first narrow frame glue extends into the second hollow portion, so that the first narrow frame glue is bonded to the display panel; or
    the upper polarizer is disposed on a side of the touch substrate close to the package cover, and the third narrow frame glue extends into the second hollow portion, so that the third narrow frame glue is bonded to the touch substrate.

11. The touch display device according to claim 2, further comprising a lower polarizer disposed on a side of the display panel away from the touch panel, wherein the lower polarizer comprises a third hollow portion corresponding to the non-display transparent portion in the non-display area.

12. A touch display device, comprising a display area and a non-display area adjacent to the display area, and further comprising:
a display panel comprising:
a first transparent substrate;
a second transparent substrate disposed opposite to the first transparent substrate; and
a second narrow frame glue disposed between the first transparent substrate and the second transparent substrate in the non-display area;
a touch panel disposed opposite to the display panel and comprising a light shielding layer in the non-display area;
a first narrow frame glue disposed between the display panel and the touch panel in the non-display area; and
a lower polarizer disposed on a side of the display panel away from the touch panel and comprising a third hollow portion in the non-display area;
wherein the display panel comprises a non-display transparent portion corresponding to the first narrow frame glue in the non-display area and comprising the second narrow frame glue, a part of the first transparent substrate in the non-display area, and a part of the second transparent substrate in the non-display area, and the third hollow portion corresponds to the non-display transparent portion.

13. The touch display device according to claim 12, wherein:
the first transparent substrate comprises:
a thin film transistor (TFT) glass substrate; and
a thin film transistor layer disposed on the TFT glass substrate, wherein a part of the thin film transistor layer in the non-display area comprises a plurality of first metal traces disposed on the TFT glass substrate, a first transparent insulating layer covering the TFT glass substrate and the first metal traces, a plurality of second metal traces disposed on the first transparent insulating layer, and a second transparent insulating layer covering the first transparent insulating layer and the second metal traces; and
the second transparent substrate comprises a color filter glass substrate.

14. The touch display device according to claim 12, wherein:
the touch panel comprises:
a package cover;
a touch substrate disposed opposite to the package cover; and
a third narrow frame glue disposed between the package cover and the touch substrate in the non-display area; and
the light shielding layer is disposed between the third narrow frame glue and the package cover.

15. The touch display device according to claim 14, further comprising a color filter layer disposed in the display panel or the touch panel and comprising a first hollow portion in the non-display area.

16. The touch display device according to claim 15, wherein:
the color filter layer is disposed in the display panel;
the second narrow frame glue extends into the first hollow portion, so that both sides of the second narrow frame glue are respectively bonded to the first transparent substrate and the second transparent substrate; and
the color filter layer is disposed on a side of the first transparent substrate close to the second transparent substrate, or on a side of the second transparent substrate close to the first transparent substrate.

17. The touch display device according to claim 15, wherein:
the color filter layer is disposed in the touch panel;
the color filter layer and the light shielding layer are disposed on a same side of the package cover close to the touch substrate; and
the light shielding layer is disposed in the first hollow portion.

18. The touch display device according to claim 17, wherein the color filter layer comprises a black matrix and a plurality of color resists disposed in the black matrix, and the black matrix and the light shielding layer have a same material and are integrally formed.

19. The touch display device according to claim 14, further comprising an upper polarizer that comprises a second hollow portion in the non-display area, wherein:
the upper polarizer is disposed on a side of the display panel close to the touch panel, and the first narrow frame glue extends into the second hollow portion, so that the first narrow frame glue is bonded to the display panel; or
the upper polarizer is disposed on a side of the touch substrate close to the package cover, and the third narrow frame glue extends into the second hollow portion, so that the third narrow frame glue is bonded to the touch substrate.

* * * * *